United States Patent
Sofer et al.

(10) Patent No.: US 8,081,026 B1
(45) Date of Patent: Dec. 20, 2011

(54) METHOD FOR SUPPLYING AN OUTPUT SUPPLY VOLTAGE TO A POWER GATED CIRCUIT AND AN INTEGRATED CIRCUIT

(75) Inventors: Sergey Sofer, Rishon Lezion (IL); Eyal Melamed-Kohen, Modi'in (IL); Valery Neiman, Rishon Lezion (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/787,457

(22) Filed: May 26, 2010

(51) Int. Cl.
*G05F 1/10* (2006.01)
(52) U.S. Cl. ........................................ 327/544
(58) Field of Classification Search .......... 327/544, 327/546
See application file for complete search history.

(56) References Cited

U.S. PATENT DOCUMENTS

| | | | |
|---|---|---|---|
| 6,140,864 A * | 10/2000 | Hirata et al. | 327/544 |
| 6,455,336 B1 | 9/2002 | Berndlmaier et al. | |
| 6,803,810 B2 * | 10/2004 | Yamada et al. | 327/544 |
| 7,368,976 B2 | 5/2008 | Gupta et al. | |
| 7,446,592 B2 | 11/2008 | Tripathi et al. | |
| 2008/0313480 A1 | 12/2008 | Malhi et al. | |

FOREIGN PATENT DOCUMENTS

WO   WO 2007113712 A1   10/2007

* cited by examiner

*Primary Examiner* — Hai L Nguyen

(57) ABSTRACT

An integrated circuit, that includes: (i) a power gating switch, the power gating switch includes (a) an input port for receiving an input supply voltage; (b) an output port for outputting an output supply voltage; and (c) a control port for receiving a control signal that determines a difference between a value of the input supply voltage and a value of the output supply voltage; (ii) a power gated circuit, coupled to the output port of the switch, for receiving the output supply voltage; (iii) a mode indicator generator for generating a mode indicator that indicates of a desired mode of the power gated circuit; (iv) a leakage indicator generator for generating a leakage indicator that indicates of a leakage level of the power gated circuit; and (iv) a control circuit, for receiving the mode indicator and the leakage indicator, and for selecting the value of the control signal based on the mode indicator and on the leakage indicator.

20 Claims, 9 Drawing Sheets

Receiving relationship information related to one or more performance oriented modes, one or more retention modes and a shut down mode. 522

Receiving relationship information for a best process case integrated circuit that includes a power gated circuit that is ideally identical to the power gated circuit of the integrated circuit. 524

Receiving relationship information indicative of the relationship between levels of the control signal and levels of the output power supply voltage for a typical process case integrated circuit that includes a power gated circuit that is ideally identical to the power gated circuit of the integrated circuit. 526

Receiving relationship information indicative of the relationship between levels of the control signal and levels of the output power supply voltage for a worst process case integrated circuit that includes a power gated circuit that is ideally identical to the power gated circuit of the integrated circuit. 528

Receiving relationship information indicative of a relationship between levels of the control signal and levels of the output power supply voltage that are supplied by the output port of the power gating switch during one or more modes of the power gated circuit. 521

Receiving relationship information for different temperatures and for different integrated circuits classes that differ from each other by their leakage. 523

Receiving relationship information for multiple temperatures for a best process case integrated circuit that includes a power gated circuit that is ideally identical to the power gated circuit of the integrated circuit. 525

Receiving relationship information for multiple temperatures for a typical process case integrated circuit that includes a power gated circuit that is ideally identical to the power gated circuit of the integrated circuit. 527

Receiving relationship information for multiple temperatures for a worst process case integrated circuit that includes a power gated circuit that is ideally identical to the power gated circuit of the integrated circuit. 529

Determining at least one level of the control signal so that the output supply voltage will be supplied during the performance oriented mode regardless of the temperature of the integrated circuit and regardless of process variations that may have occurred during the manufacturing process of the integrated circuit. 532

Determining at least one level of the control signal so that the output supply voltage will be supplied during the performance oriented mode for each leakage level of the integrated circuit out of multiple leakage levels – such as but not limited to best process case leakage level, typical process case leakage level and worst process case leakage level. 534

Determining at least one level of the control signal so that the output supply voltage will be supplied during the retention mode regardless of the temperature of the integrated circuit and regardless of process variations that may have occurred during the manufacturing process of the integrated circuit. 536

Determining at least one level of the control signal so that the output supply voltage will be supplied during the retention mode for each leakage level of the integrated circuit out of multiple leakage levels – such as but not limited to best process case leakage level, typical process case leakage level and worst process case leakage level. 538

Determining at least one level of the control signal for a performance oriented mode of the power gated circuit. 531

Determining at least one level of the control signal so that the output supply voltage will be supplied during the performance oriented mode for each temperature of the integrated circuit out of multiple temperatures of the integrated circuit and regardless of process variations that may have occurred during the manufacturing process of the integrated circuit. 533

Determining at least one level of the control signal for a retention mode of the power gated circuit. 535

Determining at least one level of the control signal so that the output supply voltage will be supplied during the retention mode for each temperature of the integrated circuit out of multiple temperatures of the integrated circuit and regardless of process variations that may have occurred during the manufacturing process of the integrated circuit. 537

METHOD FOR SUPPLYING AN OUTPUT SUPPLY VOLTAGE TO A POWER GATED CIRCUIT AND AN INTEGRATED CIRCUIT

FIELD OF THE INVENTION

This invention relates to a method for supplying an output supply voltage to a power gated circuit and to an integrated circuit that has a power gated circuit.

BACKGROUND OF THE INVENTION

Integrated circuits are manufactured by a highly complex manufacturing process. The manufacturing conditions may vary from one manufacturing process iteration to another iteration.

Accordingly, identical integrated circuits that ideally share the same design and are expected to be equal, actually differ from each other due to the semiconductor manufacturing process variations. Thus, a first integrated circuit can be faster and of a higher leakage than a second integrated circuit which design is ideally identical to the first integrated circuit.

Each manufacturing process is characterized by an allowed manufacturing process window that may include multiple process cases such as best process case, worst process case typical process case and the like.

Best process case integrated circuits are the fastest integrated circuits but exhibit the highest leakage current. Worst process case integrated circuits are the slowest integrated circuits and exhibit the lowest leakage current. Typical process case provides integrated circuits that are slower than best process case integrated circuits and are faster than worst process case integrated circuits.

Integrated circuits can be required to operate at a certain speed and to consume up to an allowable level of current. These contradicting demands can reduce the yield of the manufacturing process—as some integrated circuits can be too slow but comply to the current consumption requirements whilst some integrated circuits will exhibit a too high current consumption but comply with the speed requirements.

SUMMARY OF THE INVENTION

The present invention provides a method for supplying an output supply voltage to a power gated circuit and to an integrated circuit that has a power gated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 8 schematically illustrates an example of an embodiment of multiple stages that are includes in a stage of the method of FIG. 7; and FIG. 9 schematically illustrates an example of an embodiment of stages that are included in another stage of the method of FIG. 7.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
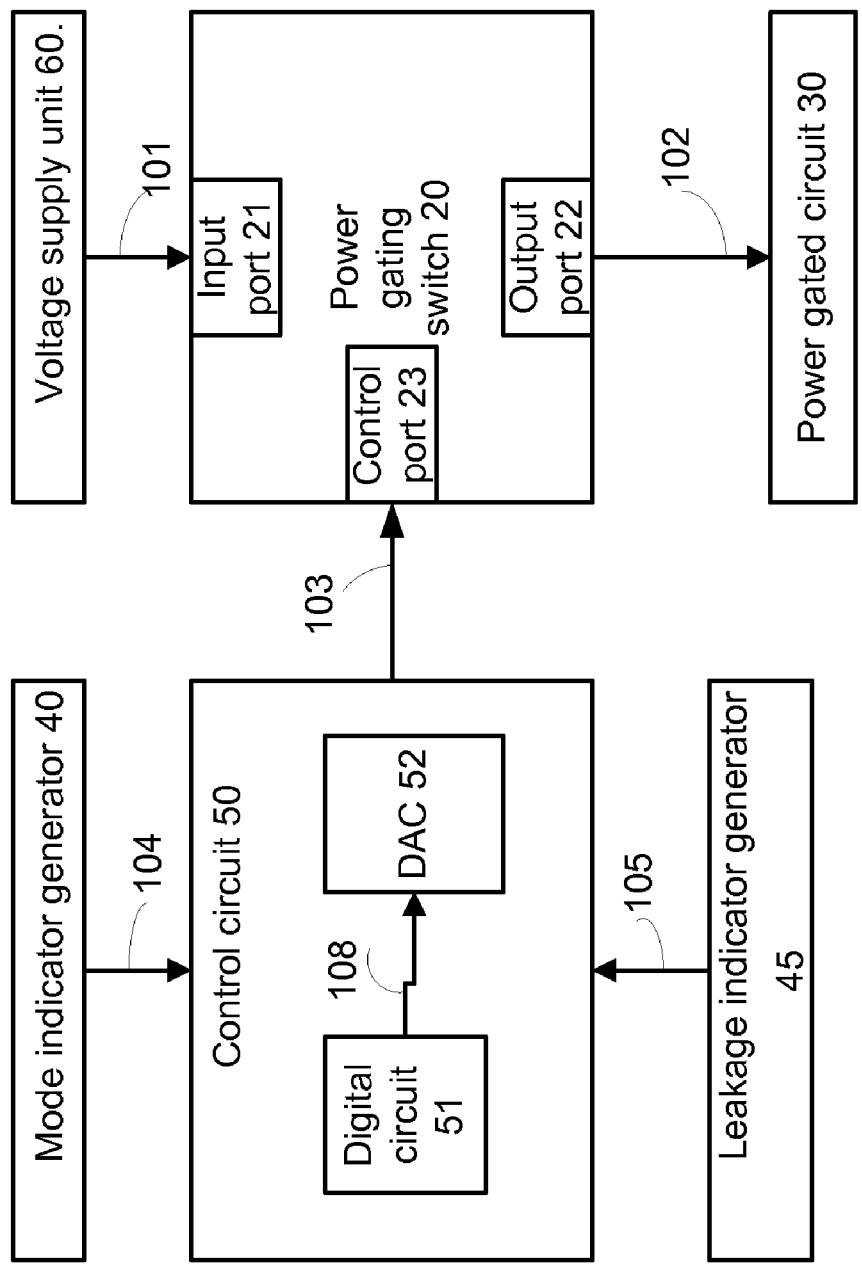
FIG. 1 schematically shows a block diagram of a first example of an embodiment of an integrated circuit.

Referring to FIG. 1, the integrated circuit 10 shown includes a power gated circuit 30, a power gating switch 20 and a control unit 50 for controlling the power gating switch by selecting a control signal that determines the conductivity of the power gating switch. This conductivity determines the difference between an input supply voltage that is provided to the power gating switch 20 and an output supply voltage that is provided from the power gating switch 20 to the power gated circuit 30.

The power gating switch 20 includes an input port 21 for receiving an input (continuous) supply voltage 101, an output port 22 for outputting an output (gated) supply voltage 102, and a control port 23 for receiving a control signal 103 that determines a difference between a value of the input supply voltage 101 and a value of the output supply voltage 102.

The power gated circuit 30 is connected to the output port 22 for receiving the output supply voltage 102.

The power gated circuit 30 can operate in at least some of the following modes: (i) a performance oriented mode (also referred to as high throughput mode or high performance mode), (ii) a retention mode, and (iii) a power gated mode. It is noted that additional modes can exist in which a different trade-off between speed and leakage can be provided.

During the retention mode the power gated circuit 30 can store data in retention circuits and consume less power in comparison to the performance oriented mode. During the power gated mode the power gated circuit 30 is shut down and accordingly data is not retained.

As explained below in more detail, the conductivity of the power gating switch 20 can, for example, be selected based on the mode of the power gated circuit 30 and on the leakage level of the integrated circuit. Accordingly, faster power gated circuits (which are more leaky) can receive output supply voltages of lower levels than slower power gated integrated circuits in order to exhibit similar performance, i.e. to lower both speed and leakage. This allows utilizing integrated circuits that are very fast (but too leaky and thus rejected) and increase the yield of the semiconductor manufacturing product.

In case the power gated circuit 30 has to be in a low power mode, also referred to as gated mode, the conductivity of the power gating switch can be set to a level that facilitates a power retention mode that is power efficient and enables memory and latch devices that belong to the power gated circuit to retain data. Retention mode is the low power mode when the integrated circuit does not perform any operation, and only retains data stored in memory or latch devices.

Additionally or alternatively, the conductivity of the power gating switch can be selected based on the temperature of the power gated circuit and on the leakage level of the integrated circuit. Accordingly, an improved trade off between performance and power consumption can be provided. As a rule of thumb—higher temperatures cause higher leakage levels. Thus, at higher temperatures, the conductivity may be selected such as to compensate for this change in leakage.

In the example of FIG. 1, the integrated circuit 10 may also be referred to as a calibrated integrated circuit 10 as it includes a control circuit 50 that is calibrated to provide, to the gating switch 20, a control signal selected based on at least one of a process case of the calibrated integrated circuit, a temperature of the integrated circuit and a mode of the power gated circuit.

In addition to the switch 20, circuit 30 and control circuit 50, the integrated circuit 10 includes a mode indicator generator 40, a leakage indicator generator 45 and a voltage supply unit 60.

The mode indicator generator 40 generates a mode indicator 104 that indicates of a desired mode of the power gated circuit, e.g. normal mode or gated mode. The mode indicator generator 40 can be, for example, a central processing unit, a part of the integrated circuit 10, a power management circuit, an interface or any other source of requests to change a mode of operation.

The leakage indicator generator 45 generates a leakage indicator 105 that indicates a leakage level of the power gated circuit 30. The leakage indicator generator 45 can for instance compose a memory in which a leakage level value is stored, e.g.: during the manufacturing process of the integrated circuit 10 or based on a leakage test conducted after the production of the integrated circuit 10. The leakage test can include measuring the actual leakage of the integrated circuit 10, or determining indirectly the leakage, e.g. evaluating the process conditions that existed during the manufacturing process of the integrated circuit 10 and classifying the process case of the integrated circuit 10. Also, the speed of the integrated circuit 10 may be measured and the leakage may be determined based on the speed and a known relationship between leakage and speed of the integrated circuit 10.

The leakage indicator generator 45 can include, for example: fuses, one time programmable element or other programmable elements that can be programmed to reflect the determined leakage. The leakage indicator 105 can, for example, indicate whether the integrated circuit 10 has a leakage level that corresponds to a best process case, typical process case or worst process case. Alternatively, the leakage indicator 105 can have a value that is selected out of a group of more than three values and can provide a finer indicator about the leakage level of the integrated circuit 10.

The control circuit 50 is connected to the leakage indicator generator for receiving the mode indicator 104. The control circuit is further connected to the mode indicator generator 40, for receiving the leakage indicator 105. The control circuit 50 can select the value of the control signal 103 based on the mode indicator 104 and on the leakage indicator 105. The control circuit 50 can output a control signal 103 that has a value that is determined based on one or more indicators. Additional considerations may be used as well, such as a minimal output supply voltage that should be supplied during one or more modes.

In the shown example, the control circuit 50 includes a digital circuit 51 that is arranged to (i) receive indicators (such as the mode indicator 104, the leakage indicator 105 and (ii) send a digital control signal 108 to a digital to analog converter (DAC) 52. The DAC 52 can be calibrated to output a control signal 103 of a desired value in response to the digital control signal 108. An example of a calibration method is provided in FIG. 7. The digital circuit 51 can include a storage element such as a register or multiple flip flops, can include one or more logical gates, can include a combination of a storage element and one or more logical gates, and the like.

The DAC 52 can be calibrated so that it will output a control signal 103 of a value that guarantees that the output supply voltage that is being supplied by the power gating switch 20 exceeds the minimal output supply voltage level.

The control circuit 50 can select the value of the control signal in any suitable manner. The control circuit 50 can for instance select a performance value for the control signal 103 when (i) the leakage indicator 105 indicates that a leakage of the power gated circuit 30 is below a low leakage threshold and (ii) the mode indicator 104 indicates that the power gated circuit 30 is requested to operate at a performance oriented mode.

Likewise, the control circuit 50 can be arranged to select a leakage reduction value of the control signal 103 suitable to reduce leakage while allowing power gated circuit 30 to operate in performance mode when (i) the leakage indicator 105 indicates that the leakage of the power gated circuit 30 is above the low leakage threshold and (ii) the mode indicator 104 indicates that the power gated circuit 30 is requested to operate at the performance oriented mode.

The low leakage threshold assists in differentiating between integrated circuits of different types—faster integrated circuits will receive lower output supply voltage levels. The value of the low leakage threshold can be based on a desired speed of the integrated circuit and on leakage limitations. Higher desired speeds may increase the value of the low leakage threshold. Accordingly, the low leakage threshold can separate between integrated circuits of different cases and even between integrated circuits of the same case. The low leakage threshold can separate best process case integrated circuits from typical process case integrated circuit. The low leakage threshold can separate typical process case integrated circuits from slow process case integrated circuit.

Also the control circuit 50 may select the performance value of the control signal 103 when the leakage indicator 105 indicates that the integrated circuit 10 is slow (and hence exhibit less leakage) in comparison to most integrated circuits of a batch of integrated circuits that includes the integrated circuit 10. Similarly, the control circuit 50 may select the leakage reduction value of the control signal 103 when the leakage indicator 105 indicates that the integrated circuit 10 is fast (and hence has high leakage) in comparison to most integrated circuits of a batch of integrated circuits that includes the integrated circuit 10.

The control circuit 50 can be arranged to select a retention value of the control signal 103 when the mode indicator 104 indicates that the power gated circuit 30 is requested to enter a retention mode.

The control circuit 50 can be arranged to select a shut down value of the control signal 103 when the mode indicator 104 indicates that the power gated circuit should be shut down.

The performance value of the control signal causes a higher conductivity of the power gating switch 20—with a lower difference between the values of the input supply voltage and the output supply voltage than the leakage reduction value of the control signal. The shutdown value causes the power gating switch 20 to shut off the power supply to the power gated circuit 30 (almost) completely and thus to have a (much) lower difference between the input and output voltage. The retention value in turn causes a difference between the leakage reduction value and the shutdown value, sufficient to retain data and below what is needed to fully operate the circuit 30.

Figure 2:
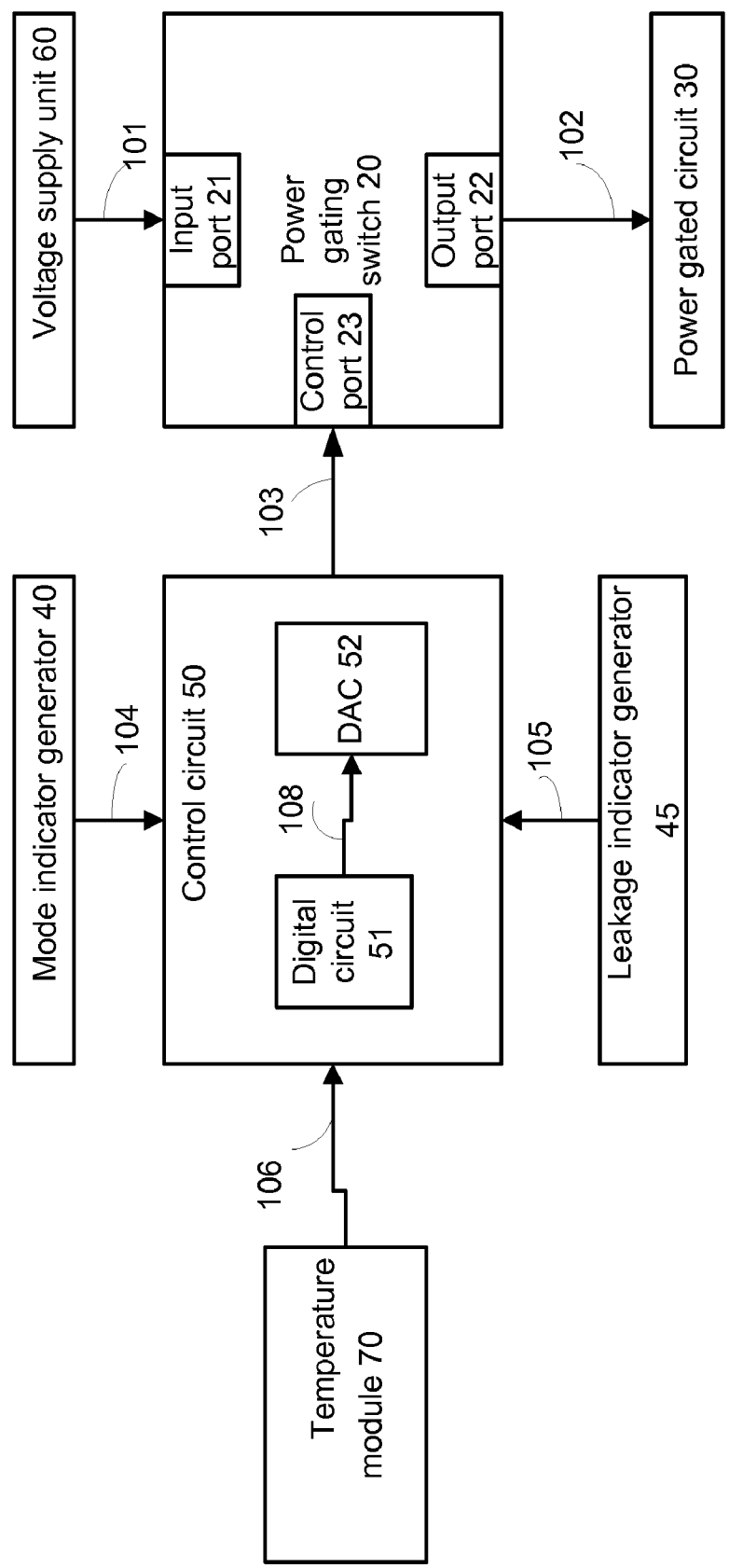
FIG. 2 schematically shows a block diagram of a second example of an embodiment of an integrated circuit.

FIG. 2 schematically shows a second example of an integrated circuit 11.

The integrated circuit 11 differs from the integrated circuit 10 by including, in addition to the components shown in FIG. 1, a temperature module 70.

The temperature module 70 is arranged to provide a temperature indication 106 that indicates a temperature of the integrated circuit 11, or of at least the power gated circuit 30. The temperature module 70 can for example include a temperature sensor, can be connected to a power sensor or can estimate the temperature of the power gated circuit 30 based on electrical or speed measurements that reflect the temperature. For example the temperature module 70 can include a temperature sensitive component of known temperature to electrical feature relationship. The temperature module 70 can include a temperature affected oscillator and an oscillation measurement unit that can provide an indicator about the temperature of the oscillator based on the oscillation measurements.

Figure 3:
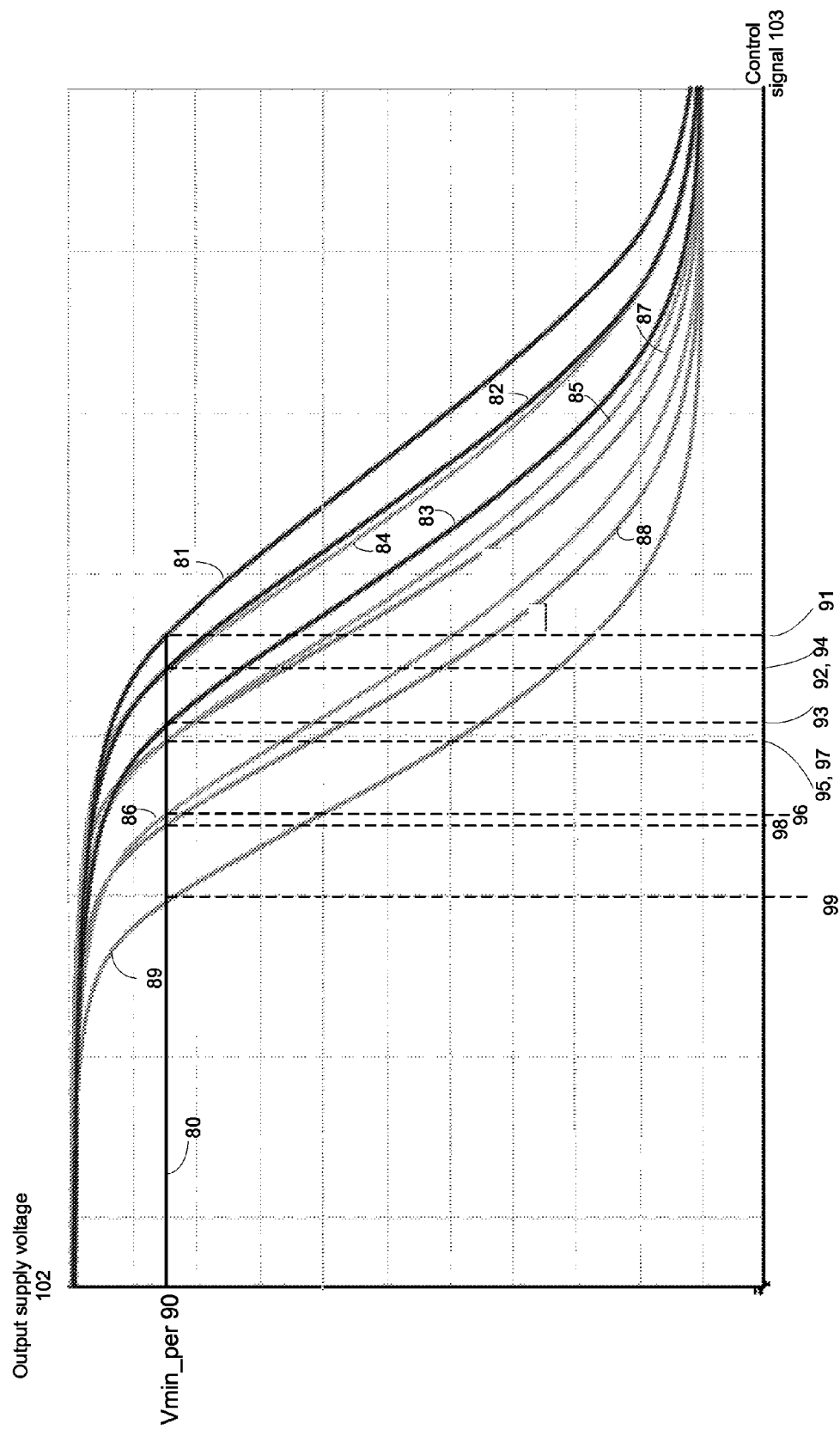
FIG. 3 schematically shows a graph of relationships between levels of a control signal that is supplied to a control port of the power gating switch during a performance oriented mode and levels of the output power supply voltage that are supplied by the output port of the power gating switch, for different temperatures and for different process case integrated circuits.
Figure 4:
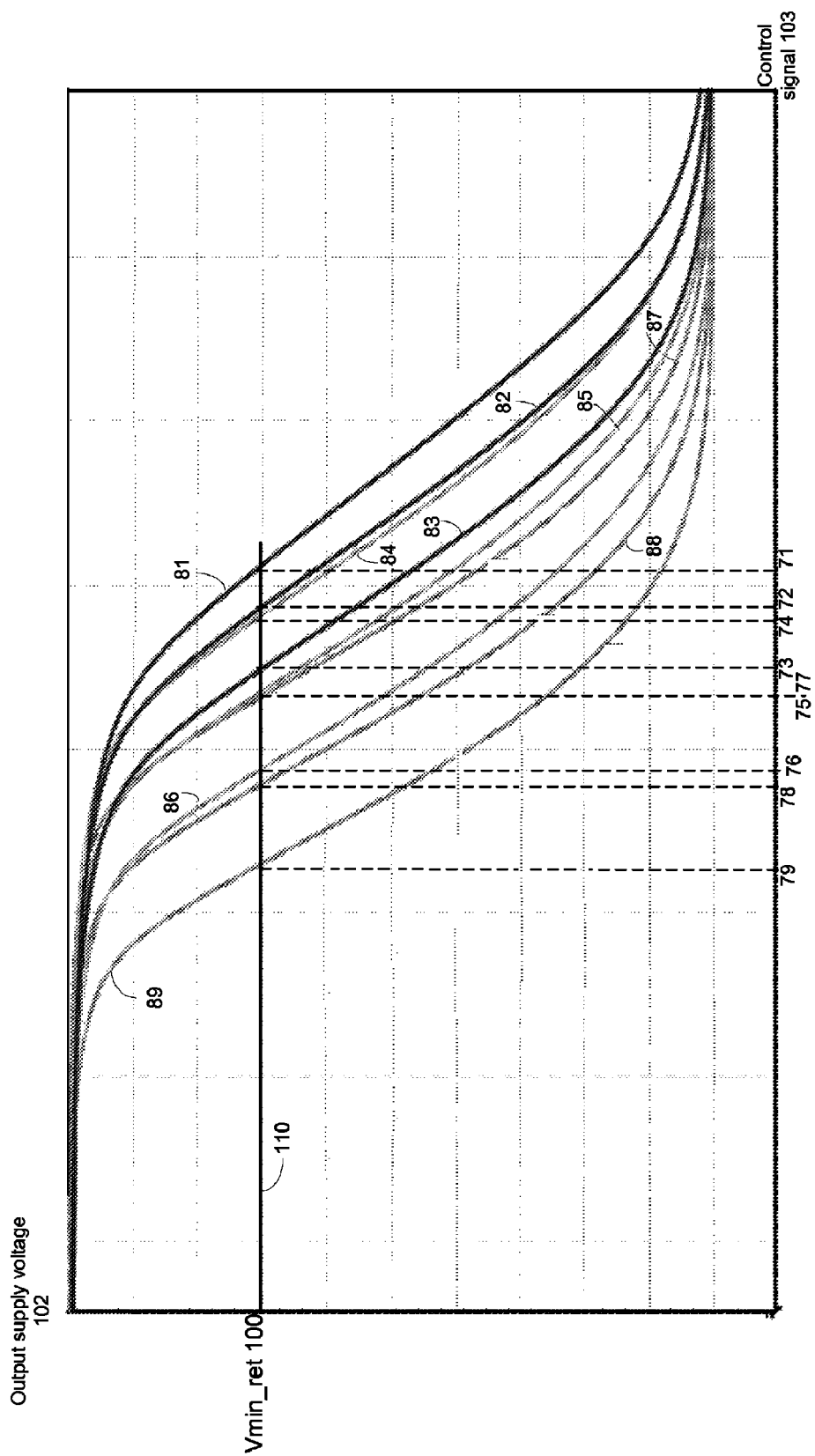
FIG. 4 schematically shows a graph of relationships between levels of a control signal that is supplied to a control port of the power gating switch during a retention mode and levels of the output power supply voltage that are supplied by the output port of the power gating switch, for different temperatures and for different process case integrated circuits.

The control circuit 50 can receive a temperature indication 106 and select, based on a temperature of the integrated circuit, a leakage reduction value out of a group of leakage reduction values. The leakage reduction values may be associated with different temperatures. For example—the various curves of FIG. 3 and FIG. 4 provide the relationship between levels of the control signal 103 and levels of the output supply voltage 102 for high, medium and low temperatures. The temperature indication 106 can assist in selecting which curve (and accordingly—which value of control signal) to elect.

The control circuit 50 can be arranged to select a retention value out of a group of retention values based on the temperature indicator 106.

FIG. 3 schematically shows a graph of relationships between levels of a control signal that is supplied to a control port of the power gating switch during a performance oriented mode and levels of the output power supply voltage that are supplied by the output port of the power gating switch for different temperatures and for different process case integrated circuits.

FIG. 3 illustrates these relationships for a PMOS power gating switch in which the conductivity of the power gating switch increases as the level of the control signal 103 decreases (for constant input supply voltage). It is noted that the power gating switch can be an NMOS power gating switch in which the conductivity of the power gating switch decreases as the level of the control signal 103 decreases (for constant input supply voltage).

In FIG. 3 the X-axis illustrates the levels of the control signal 103 while the Y-axis illustrates the levels of the output supply voltage 102. In the shown example, these levels range between 0 and 1 volts but other values are possible, depending on the manufacturing technology mode.

A minimal output power supply voltage threshold of the performance oriented mode is denoted Vmin_per 90 (80). In the performance oriented mode of the power gated circuit 30 the value of output supply voltage 102 should exceed Vmin_per 90. The value that power gated circuit 30 functions properly in a performance oriented mode.

Suitable minimal output supply thresholds of the performance oriented mode can, for example, be defined by observing a value of the control signals that may guarantee that the power gated circuit will function at a performance oriented mode, i.e. based on trial and error.

In FIG. 3, curves 81-89 represent relationships between levels of the control signal 103 and levels of the output supply voltage 102 for nine combinations of temperature (high temperature, medium temperature, low temperature) and process variations (best process case, medium process case and low process case) and a threshold line 80 of a performance oriented mode.

The levels of the control signal for the performance oriented mode can be set to correspond to the intersection point between each of curves 81-89 and the threshold line 80.

Curve 81 represents the relationship between levels of the control signal 103 and levels of the output supply voltage 102 for a high temperature and for a best process case integrated circuit. The intersection point between curve 81 and the threshold line 80 defines a best process case high temperature level 91 of the control signal 103 that, once provided to a best process case integrated circuit that is at a high temperature, guarantees that the level of the output supply voltage 102 is not lower than Vmin_per 90.

Curve 84 represents the relationship between levels of the control signal 103 and levels of the output supply voltage 102 for a medium temperature and for a best process case integrated circuit. The intersection point between curve 84 and the threshold line 80 defines a best process case medium temperature level 94 of the control signal 103 that, once provided to a best process case integrated circuit that is at a medium or high temperature, guarantees that the level of the output supply voltage 102 is not lower than Vmin_per 90.

Curve 87 represents the relationship between levels of the control signal 103 and levels of the output supply voltage 102 for a low temperature and for a best process case integrated circuit. The intersection point between curve 87 and the threshold line 80 defines a best process case low temperature level 97 of the control signal 103 that, once provided to a best process case integrated circuit is at a low temperature, guarantees that the level of the output supply voltage 102 is not lower than Vmin_per 90. If the integrated circuit is a best process type integrated circuit, then providing a control signal 103 of a level that does not exceed best process case low temperature level 97 guarantees that a best process case integrated circuit will function at a performance oriented mode.

Curve 82 represents the relationship between levels of the control signal 103 and levels of the output power supply voltage 102 for a high temperature and for a typical process case integrated circuit. The intersection point between curve 82 and the threshold line 80 defines a typical process case high temperature level 92 of the control signal 103 that once provided to a typical process case integrated circuit that is at a high temperature, guarantees that the level of the output supply voltage 102 is not lower than Vmin_per 90.

Curve 85 represents the relationship between levels of the control signal 103 and levels of the output power supply voltage 102 for a medium temperature and for a typical process case integrated circuit. The intersection point between curve 85 and the threshold line 80 defines a typical process case medium temperature level 95 of the control signal 103 that, once provided to a typical process case integrated circuit that is at a medium or high temperature, guarantees that the level of the output supply voltage 102 is not lower than Vmin_per 90.

Curve 88 represents the relationship between levels of the control signal 103 and levels of the output power supply voltage 102 for a low temperature and for a typical process case integrated circuit. The intersection point between curve 88 and the threshold line 80 defines a typical process case low temperature level 98 of the control signal 103 that, once provided to a typical process case integrated circuit that is at low temperature, guarantees that the level of the output supply voltage 102 is not lower than Vmin_per 90.

Curve 83 represents the relationship between levels of the control signal 103 and levels of the output power supply voltage 102 for a high temperature and for a worst process case integrated circuit. The intersection point between curve 83 and the threshold line 80 defines a worst process case low temperature level 93 of the control signal 103 that, once provided to a worst process case integrated circuit that is at a high temperature, guarantees that the level of the output supply voltage 102 is not lower than Vmin_per 90.

Curve 86 represents the relationship between levels of the control signal 103 and levels of the output power supply voltage 102 for a medium temperature and for a worst process case integrated circuit. The intersection point between curve 86 and the threshold line 80 defines a worst process case medium temperature level 96 of the control signal 103 that, once provided to a worst process case integrated circuit that is at a medium temperature, guarantees that the level of the output supply voltage 102 is not lower than Vmin_per 90.

Curve 89 represents the relationship between levels of the control signal 103 and levels of the output power supply voltage 102 for a low temperature and for a worst process case integrated circuit. The intersection point between curve 89 and the threshold line 80 defines a worst process case low temperature level 99 of the control signal 103 that, once provided to any type of integrated circuit (worst process case, medium process case and best process case) at any temperature, guarantees that the level of the output supply voltage 102 is not lower than Vmin_per 90.

FIG. 4 schematically shows an example of relationships between levels of a control signal that is supplied to a control port of the power gating switch in a retention mode and levels of the output power supply voltage that are supplied by the output port of the power gating switch for different temperatures and for different process case integrated circuits (at constant input supply voltage).

FIG. 4 illustrates these relationships for a PMOS power gating switch in which a conductivity of the power gating switch increases as the level of the control signal 103 decreases. It is noted that the power gating switch can be an NMOS power gating switch in which the conductivity of the power gating switch decreases as the level of the control signal 103 decreases.

In FIG. 4, a minimal output power supply voltage threshold of the retention mode is denoted Vmin_ret 100 (110). During the retention mode of the power gated circuit 30 the value of output supply voltage 102 should exceed Vmin_ret 100. The value of Vmin_ret 100 is set in order to guarantee that power gated circuit 30 properly functions at a retention mode, i.e. that data is properly retained. Vmin_ret 100 is lower than Vmin_per 90.

Suitable minimal output supply thresholds for the retention mode can, for example, be defined by observing which values of the control signals 103 guarantee that the power gated circuit function as required in the retention mode.

FIG. 4 shows curves 81-89 that represent relationships between levels of the control signal 103 and levels of the output power supply voltage 102 for nine combinations of temperature (high temperature, medium temperature, low temperature) and process variations (best process case, medium process case and low process case) and a threshold line 110 of a retention mode.

The intersection point between each of curves 81-89 and the threshold line 110 can define the levels of the control signal for the retention mode.

Curve 81 represents the relationship between levels of the control signal 103 and levels of the output power supply voltage 102 for a high temperature and for a best process case integrated circuit. The intersection point between curve 81 and threshold line 100 defines a best process case high temperature level 91 of the control signal 103 that, once provided to a best process case integrated circuit that is at a high temperature, guarantees that the level of the output supply voltage 102 is not lower than Vmin_ret 100. It is the highest value of control signal 103 out of values 91-99 are reflects the lowest conductivity of the power gating switch.

Curve 84 represents the relationship between levels of the control signal 103 and levels of the output power supply voltage 102 for a medium temperature and for a best process case integrated circuit. The intersection point between curve 84 and threshold line 110 defines a best process case medium temperature level 94 of the control signal 103 that, once provided to a best process case integrated circuit that is at a medium or high temperature, guarantees that the level of the output supply voltage 102 is not lower than Vmin_ret 100.

Curve 87 represents the relationship between levels of the control signal 103 and levels of the output power supply voltage 102 for a low temperature and for a best process case integrated circuit. The intersection point between curve 87 and threshold line 110 defines a best process case low temperature level 97 of the control signal 103 that, once provided to a best process case integrated circuit that is at a low temperature, guarantees that the level of the output supply voltage 102 is not lower than Vmin_ret 100.

Curve 82 represents the relationship between levels of the control signal 103 and levels of the output power supply voltage 102 for a high temperature and for a typical process case integrated circuit. The intersection point between curve 82 and threshold line 110 defines a typical process case high temperature level 92 of the control signal 103 that, once provided to a medium process case integrated circuit that that is at a high temperature, guarantees that the level of the output supply voltage 102 is not lower than Vmin_ret 100.

Curve 85 represents the relationship between levels of the control signal 103 and levels of the output power supply voltage 102 for a medium temperature and for a typical process case integrated circuit. The intersection point between curve 85 and threshold line 110 defines a typical process case medium temperature level 95 of the control signal 103 that, once provided to a medium process case integrated circuit that is at a medium or high temperature, guarantees that the level of the output supply voltage 102 is not lower than Vmin_ret 100.

Curve 88 represents the relationship between levels of the control signal 103 and levels of the output power supply voltage 102 for a low temperature and for a typical process case integrated circuit. The intersection point between curve 86 and threshold line 110 defines a typical process case low temperature level 98 of the control signal 103 that, once provided to a typical process case integrated circuit, guarantees that the level of the output supply voltage 102 is not lower then Vmin_ret 100.

Curve 83 represents the relationship between levels of the control signal 103 and levels of the output power supply voltage 102 for a high temperature and for a worst process case integrated circuit. The intersection point between curve 83 and threshold line 110 defines a worst process case high temperature level 93 of the control signal 103 that, once provided to a worst process case integrated circuit that that is at a high temperature, guarantees that the level of the output supply voltage 102 is not lower then Vmin_ret 100.

Curve 86 represents the relationship between levels of the control signal 103 and levels of the output power supply voltage 102 for a medium temperature and for a worst process case integrated circuit. The intersection point between curve 86 and threshold line 110 defines a worst process case medium temperature level 96 of the control signal 103 that, once provided to a worst process case integrated circuit that that is at a medium temperature, guarantees that the level of the output supply voltage 102 is not lower then Vmin_ret 100.

Curve 89 represents the relationship between levels of the control signal 103 and levels of the output power supply voltage 102 for a low temperature and for a worst process case integrated circuit. The intersection point between curve 89 and threshold line 110 defines a worst process case low temperature level 99 of the control signal 103 that, once provided to any type of integrated circuit (worst process case, medium process case and best process case) at any temperature, guarantees that the level of the output supply voltage 102 is not lower then Vmin_ret 100.

Figure 5:
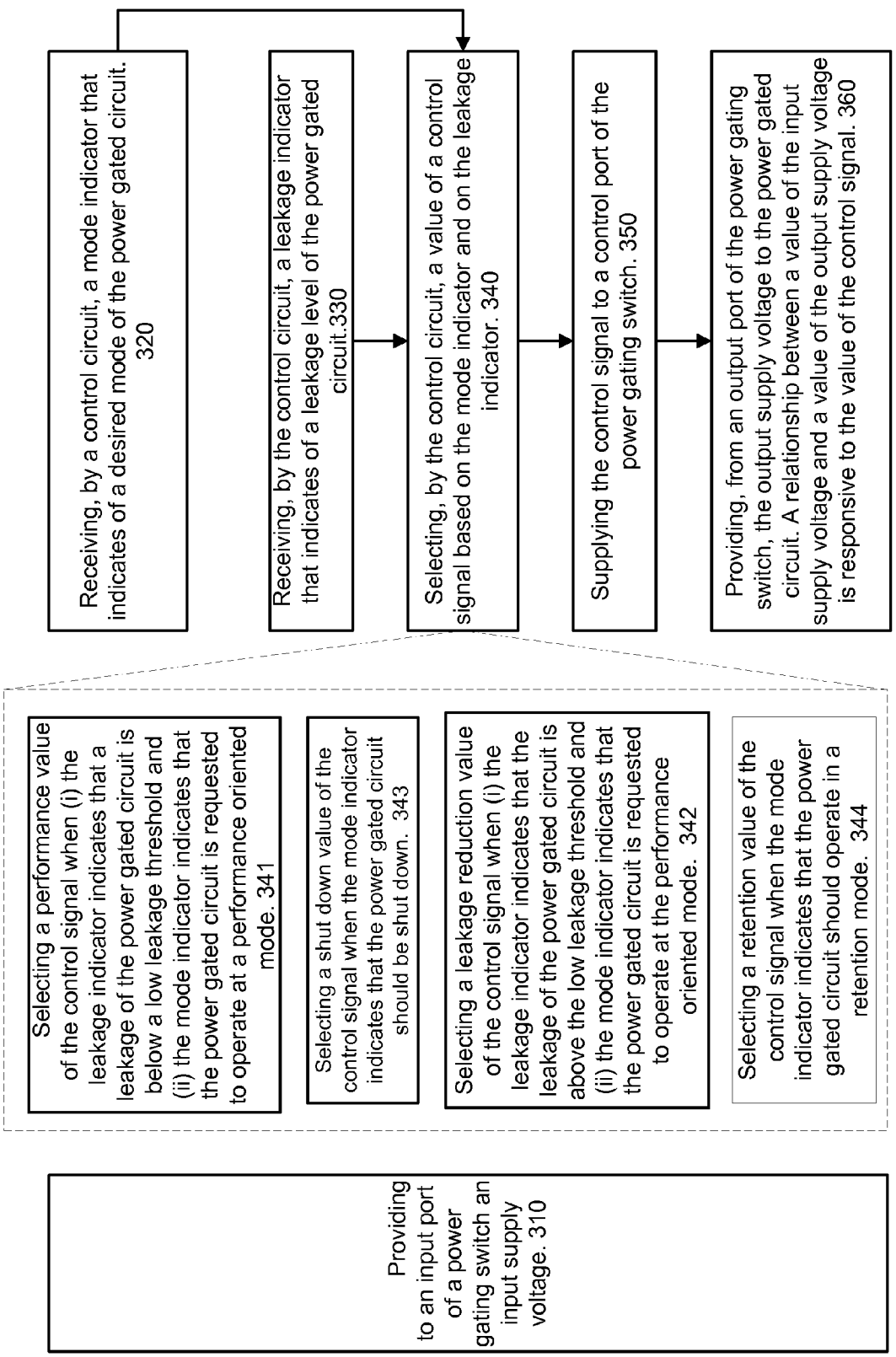
FIG. 5 schematically shows a flowchart of an example of a method for supplying an output supply voltage to a power gated circuit.

FIG. 5 schematically shows a flow-chart of an embodiment of a method 300 for supplying an output supply voltage to a power gated circuit.

FIG. 5 shows stages 310, 320, 330, 340, 350 and 360.

Stage 310 includes providing to an input port of a power gating switch an input supply voltage. Stage 310 is executed while other stages of method 300 (such as stages 320, 330, 340, 350 and 360) are being executed.

In the shown flow-chart, respective separate blocks are shown. However, it will be apparent that the stages illustrated thereby may be performed in a continuous and/or parallel manner.

Stage 320 includes receiving, by a control circuit, a mode indicator that indicates of a desired mode of the power gated circuit.

Stage 330 includes receiving, by the control circuit, a leakage indicator that indicates of a leakage level of the power gated circuit.

Stage 320 and 330 are followed by stage 340 of selecting, by the control circuit, a value of a control signal based on the mode indicator and on the leakage indicator.

Stage 340 is followed by stage 350 of supplying the control signal to a control port of the power gating switch.

Stage 350 is followed by stage 360 of providing, from an output port of the power gating switch, the output supply voltage to the power gated circuit. A relationship between a value of the input supply voltage and a value of the output supply voltage is responsive to the value of the control signal.

Stage 340 can include at least one out of stages 341, 342, 343 and 344.

Stage 341 includes selecting a performance value of the control signal when (i) the leakage indicator indicates that a leakage of the power gated circuit is below a low leakage threshold and (ii) the mode indicator indicates that the power gated circuit is requested to operate at a performance oriented mode.

Stage 342 includes selecting a leakage reduction value of the control signal when (i) the leakage indicator indicates that the leakage of the power gated circuit is above the low leakage threshold and (ii) the mode indicator indicates that the power gated circuit is requested to operate at the performance oriented mode. The performance value of the control signal is associated with a difference between the values of the input supply voltage and the output supply voltage, wherein the difference is lower than the leakage reduction value of the control signal.

Stage 343 includes selecting a shut down value of the control signal when the mode indicator indicates that the power gated circuit should be shut down.

Stage 344 includes selecting a retention value of the control signal when the mode indicator indicates that the power gated circuit should operate in a retention mode. Stage 344 can include selecting a retention value out of a group of retention values based on the leakage indicator. Additionally or alternatively, stage 344 can include selecting a retention value of the control signal base on an additional indication (such as a temperature indication).

Figure 6:
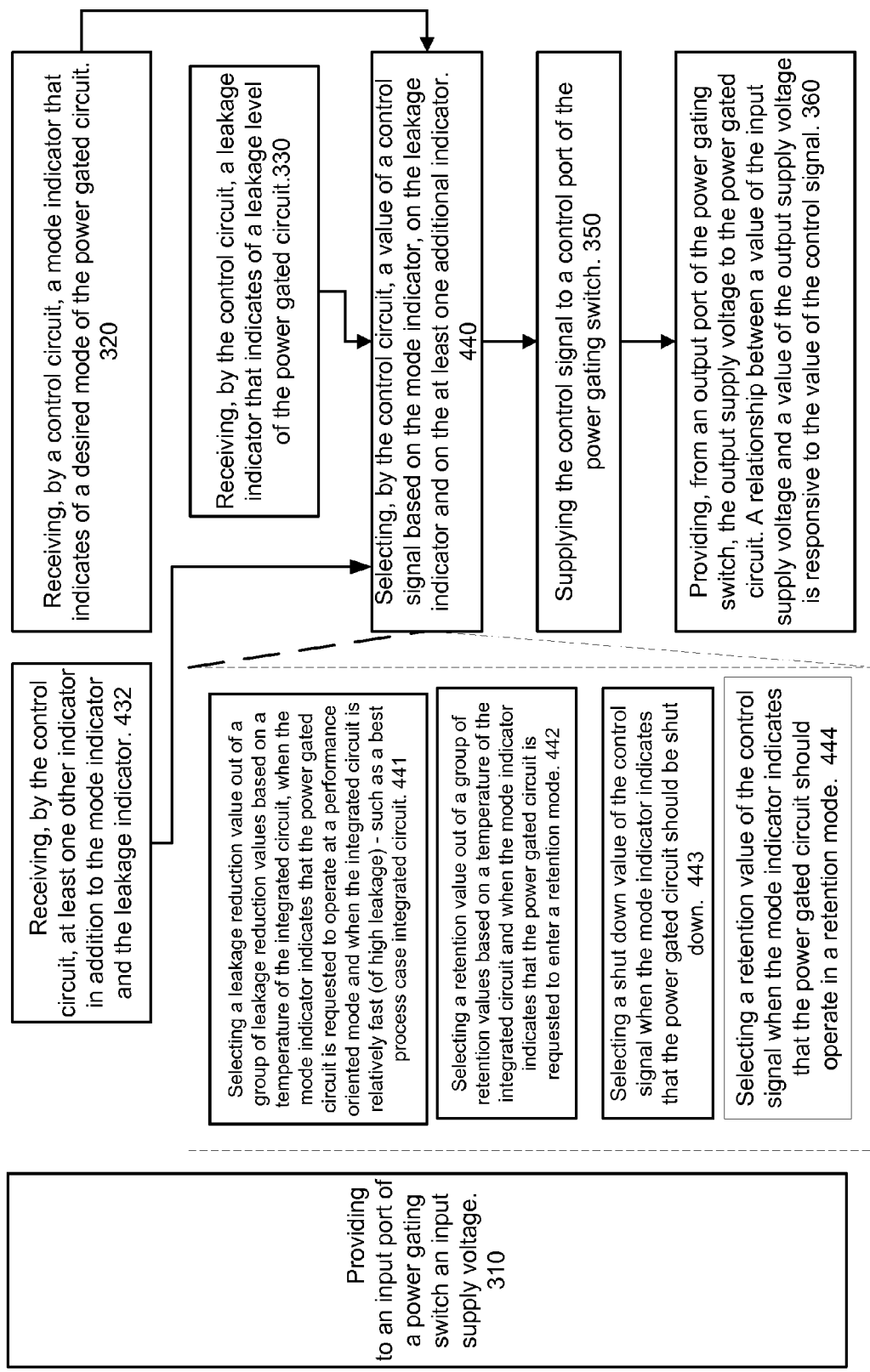
FIG. 6 schematically shows a flowchart of an example of a method for supplying an output supply voltage to a power gated circuit.

FIG. 6 schematically shows a flow-chart of an example of a method 400 for supplying an output supply voltage to a power gated circuit.

Method 400 differs from method 300 by including stage 432 and by including stage 440 instead of stage 340.

Stage 432 includes receiving, by the control circuit, at least one other indicator in addition to the mode indicator and the leakage indicator. The other indicator can be a temperature indicator. Other additional indicators can be received.

The temperature indicator indicates a local temperature of the power gated circuit 30 of the integrated circuit 11 or ambient temperature (see FIG. 2), further referred as "temperature".

Stages 320, 330 and 432 are followed by stage 440 of selecting, by the control circuit, a value of a control signal based on the mode indicator, on the leakage indicator and on the at least one additional indicator.

Stage 440 may include stage 441 of selecting a leakage reduction value out of a group of leakage reduction values based on the temperature of the integrated circuit, when the mode indicator indicates that the power gated circuit is requested to operate at a performance oriented mode, when the integrated circuit is relatively fast (of high leakage)—such as a best process case integrated circuit.

Referring back to FIG. 3, levels 91-93 and 95-99 of the control signal 103 can be the group of leakage reduction values. Alternatively, the respective sets of levels 91, 94 and 97 and 92, 95 and 98, can form respective groups of levels.

Stage 440 may include stage 442 of selecting, when the mode indicator indicates that the power gated circuit is requested to enter a retention mode, a retention value out of a group of retention values based on a temperature of the integrated circuit.

Stage 440 can include a stage (not shown) of selecting a performance oriented value out of a group of performance oriented values based on the temperature of the integrated circuit, when the mode indicator indicates that the power gated circuit is requested to operate at a performance oriented mode. Referring to FIG. 3, each of levels 93, 96 and 99 can be regarded as a performance oriented level.

Stage 440 can include stage 443 of selecting a shut down value of the control signal when the mode indicator indicates that the power gated circuit should be shut down.

Stage 440 can include stage 444 of selecting a retention value of the control signal when the mode indicator indicates that the power gated circuit should operate in a retention mode. Stage 444 can include selecting a retention value out of a group of retention values based on the leakage indicator. Additionally or alternatively, stage 444 can include selecting a retention value of the control signal base on an additional indication (such as a temperature indication).

Stage 440 is followed by stage 350.

Figure 7:
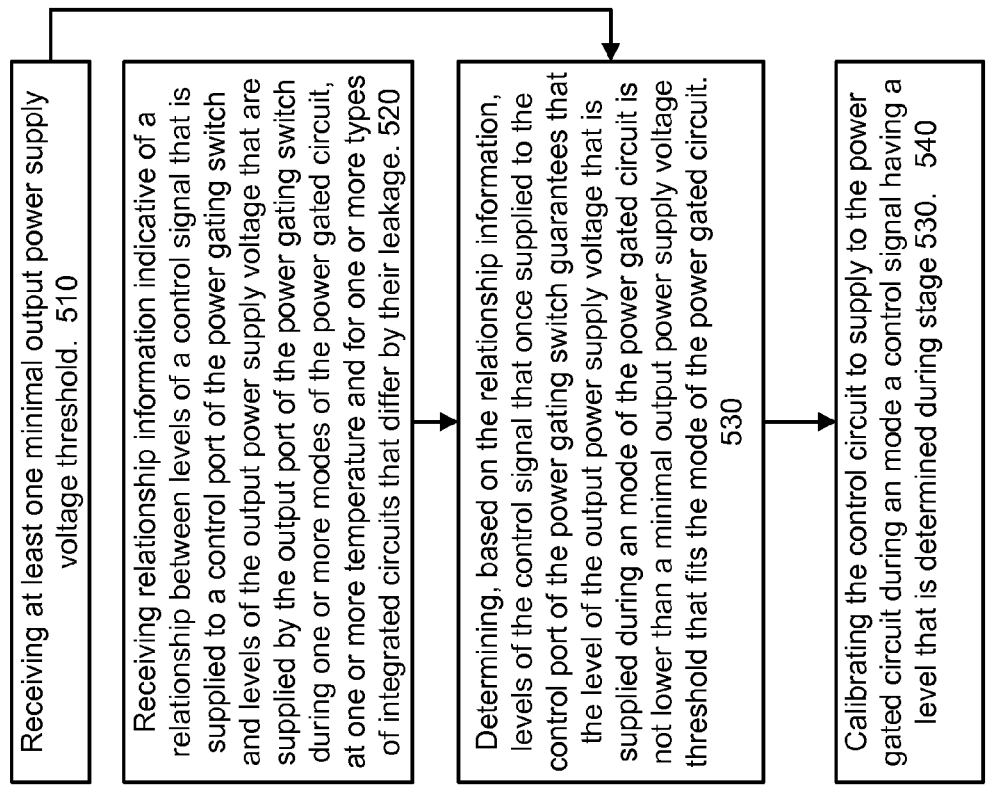
FIG. 7 schematically shows a flowchart of an example of a method for calibrating a control circuit of a calibrated integrated circuit.

FIG. 7 schematically shows a flow-chart of an example of a method 500 for calibrating a control circuit of a calibrated integrated circuit.

Method 500 starts by stages 510 and 520.

Stage 510 includes receiving at least one minimal output power supply voltage threshold. A power gating switch can operate in different modes and in this example in each mode, the power gated circuit should receive an output supply voltage (from a power gating switch) that is not lower than the minimal output power supply threshold for that mode. For example, a performance oriented mode may have a minimal output power supply voltage threshold that is higher than a minimal output power supply voltage threshold of a retention mode.

Stage 520 includes receiving relationship information about a relationship between levels of a control signal supplied to a control port of the power gating switch and the output power supply voltage that are provided by the output port of the power gating switch in one or more modes of the power gated circuit, for one or more temperatures and for one or more types of integrated circuits differing in leakage current.

Stage 520 can include stages 521, 522, 523, 524, 525, 526, 527, 528 and 529 or a combination thereof. These stages are illustrated in FIG. 8.

Stage 521 includes receiving relationship information about relationship between levels of a control signal supplied to a control port of the power gating switch and the output power supply voltage at the output port of the power gating switch, in one or more different modes of the power gated circuit.

Stage 522 includes receiving relationship information related to one or more performance oriented modes, one or more retention modes and a shut down mode.

Stage 523 includes receiving relationship information for different temperatures and for different integrated circuits classes differing by their leakage current. The classes can include for example a best process case integrated circuit, a typical process case integrated circuit, a worst process case integrated circuit as well as other suitable classes. The number of different classes may be any suitable number. The relationship information reflects the behaviour of integrated circuits with the same design as the integrated circuit that is being calibrated by different leakage levels.

Stage 524 includes receiving relationship information for a best process case integrated circuit that includes a power gated circuit that is ideally identical to the power gated circuit of the integrated circuit.

Stage 525 includes receiving, for the class of a best process case integrated circuit, the relationship information for multiple temperatures that includes a power gated circuit that is ideally identical to the power gated circuit of the integrated circuit. These temperatures can be in a tolerable range of temperatures that the power gated circuit is expected to withstand. This tolerable range can be delimited by a low temperature and a high temperature, about which relationship information is provided. The multiple temperatures can also include a medium temperature, situated between the low and high temperature. It is noted that the information can include more than these three temperatures.

Stage 526 includes receiving relationship information about the relationship between levels of the control signal and output power supply voltage for a typical process case integrated circuit (that includes a power gated circuit with the same design as the power gated circuit of the integrated circuit).

Stage 527 includes receiving relationship information for multiple temperatures, for a typical process case integrated circuit.

Stage 528 includes receiving, for a worst process case integrated circuit, relationship information indicative of the relationship between levels of the control signal and levels of the output power supply voltage.

Stage 529 includes receiving, for a worst process case integrated circuit, relationship information for multiple temperatures.

Referring back to FIG. 7, stage 510 and 520 are followed by stage 530 of determining, based on the relationship information, levels of the control signal that once supplied to the control port of the power gating switch guarantees that the output power supply voltage supplied in a mode of the power gated circuit is not lower than a minimal output power supply voltage threshold that fits the mode of the power gated circuit.

Stage 530 can include either one of stages 531, 532, 533, 534, 535, 536, 537, 538 and 539 or a combination thereof. These stages are illustrated in FIG. 9.

Stage 531 includes determining at least one level of the control signal for a performance oriented mode of the power gated circuit.

A highest level of the control signal 103 can be regarded as a performance mode level while at least one lower level of the control signal 103 can be regarded as leakage reduction mode level. It is noted that more than a single performance mode level can be selected.

Each level of the control signal 103 can be determined based on the leakage of the integrated circuit, the temperature of the integrated circuit or a combination thereof.

Accordingly, each value of an indicator (such as leakage indicator 104, temperature indicator 106 and the like) will be associated with a corresponding level of the control signal that once supplied during the performance oriented mode will guarantee that the output supply voltage will not be lower than the minimum output power supply voltage threshold of the performance oriented mode.

Stage 532 includes determining at least one level of the control signal so that the output supply voltage will be supplied during the performance oriented mode regardless of the temperature of the integrated circuit and regardless of process variations that may have occurred during the manufacturing process of the integrated circuit. This level can be determined based on relationship information for a high temperature (for example—a highest tolerable temperature) and for a best process case integrated circuit.

Stage 533 includes determining at least one level of the control signal so that the output supply voltage will be supplied during the performance oriented mode for each temperature of the integrated circuit out of multiple temperatures of the integrated circuit and regardless of process variations that may have occurred during the manufacturing process of the integrated circuit.

Stage 534 includes determining at least one level of the control signal so that the output supply voltage will be supplied during the performance oriented mode for each leakage level of the integrated circuit out of multiple leakage levels—such as but not limited to best process case leakage level, typical process case leakage level and worst process case leakage level.

Stage 535 includes determining at least one level of the control signal for a retention mode of the power gated circuit. The levels of the control signal 103 to be provided during the retention mode can be determined based on the leakage of the integrated circuit, the temperature of the integrated circuit or a combination thereof. Thus, the values of an indicator (such as leakage indicator 104, temperature indicator 106 and the like) will be associated with a corresponding level of the control signal, that once supplied during the retention mode, ensures that the output supply voltage will not be lower than the minimum output power supply voltage threshold of the retention mode.

Stage 536 includes determining at least one level of the control signal of which the output supply voltage will be supplied during the retention mode, regardless of the temperature of the integrated circuit and regardless of process variations that may have occurred during the manufacturing process of the integrated circuit. This level can be determined based on relationship information for a high temperature (for example—a highest tolerable temperature) and for a best process case integrated circuit.

Stage 537 includes determining at least one level of the control signal so that the output supply voltage will be supplied during the retention mode for each temperature of the integrated circuit out of multiple temperatures of the integrated circuit and regardless of process variations that may have occurred during the manufacturing process of the integrated circuit.

Stage 538 includes determining at least one level of the control signal so that the output supply voltage will be supplied during the retention mode for each leakage level of the integrated circuit out of multiple leakage levels—such as but not limited to best process case leakage level, typical process case leakage level and worst process case leakage level.

Referring back to FIG. 7, stage 530) is followed by stage 540 of calibrating the control circuit to supply to the power gated circuit during a mode of the power gated circuit 30 a control signal having a level that is determined during stage 530.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein (for example—digital control signal 108) may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the control circuit 50 can be partitioned to a digital interface and a digital to analog converter.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as any number of separate integrated circuits or separate devices interconnected with each other in a suitable manner. For example, the can reside on a different integrated circuit.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An integrated circuit, comprising:
   a power gating switch, the switch comprises:
      an input port for receiving an input supply voltage;
      an output port for providing an output supply voltage to a power gated circuit; and
      a control port for receiving a control signal that determines a difference between the input supply voltage and the output supply voltage;
   wherein the integrated circuit further comprising the power gated circuit, being gated relative to the input supply voltage by the switch, the power gated circuit being coupled to the output port of the switch for receiving the output supply voltage;
   a mode indicator generator for generating a mode indicator that indicates a desired mode of the power gated circuit;
   a leakage indicator generator for generating a leakage indicator that indicates a leakage level of the power gated circuit; and
   a control circuit, connected to the mode indicator generator and the leakage indicator generator, for receiving the mode indicator and the leakage indicator, the control circuit being arranged to select the value of the control signal based on the mode indicator and on the leakage indicator.

2. The integrated circuit according to claim 1, wherein the control circuit is arranged to:
   select a performance value of the control signal when (i) the leakage indicator indicates that a leakage of the power gated circuit is below a low leakage threshold and (ii) the mode indicator indicates that the power gated circuit is requested to operate at a performance oriented mode;
   select a leakage reduction value of the control signal when (i) the leakage indicator indicates that the leakage of the power gated circuit is above the low leakage threshold and (ii) the mode indicator indicates that the power gated circuit is requested to operate at the performance oriented mode; and
   select a shut down value of the control signal when the mode indicator indicates that the power gated circuit should be shut down.

3. The integrated circuit according to claim 2, wherein the control circuit is arranged to select the leakage reduction value out of a group of leakage reduction values based on a temperature of the integrated circuit.

4. The integrated circuit according to claim 2, wherein the control circuit is arranged to select the leakage reduction value out of a group of leakage reduction values based on a temperature of the integrated circuit and on the leakage indicator of the integrated circuit.

5. The integrated circuit according to claim 2, wherein the control circuit is arranged to select a retention value of the control signal when the mode indicator indicates that the power gated circuit is requested to enter a retention mode.

6. The integrated circuit according to claim 5, wherein the control circuit is arranged to select a retention value out of a group of retention values based on a temperature of the integrated circuit.

7. The integrated circuit according to claim 5, wherein the control circuit is arranged to select the retention value out of a group of retention values based on a temperature of the integrated circuit and on the leakage indicator.

8. The integrated circuit according to claim 2, wherein the control circuit is arranged to:
   select the performance value of the control signal when the leakage indicator indicates that the integrated circuit is slow in comparison to most integrated circuits of a batch of integrated circuits that comprises the integrated circuit, and (ii) the mode indicator indicates that the power gated circuit is requested to operate at a performance oriented mode.

9. The integrated circuit according to claim 1, further comprising:
   a temperature module connected to the control circuit, the temperature module arranged to provide a temperature indication that indicates a temperature of the integrated circuit to the control circuit.

10. The integrated circuit according to claim 9, wherein the temperature module is arranged to:
    estimate a temperature of the power gated circuit based on electrical measurements of the power gated circuit that reflect the temperature of the power gated circuit.

11. The integrated circuit according to claim 9, wherein the temperature module is arranged to:
    estimate a temperature of the power gated circuit based on speed measurements of the power gated circuit that reflect the temperature of the power gated circuit.

12. The integrated circuit according to claim 11, wherein the control circuit is arranged to:
    select the leakage reduction value of the control signal when (i) the leakage indicator indicates that the integrated circuit is fast in comparison to most integrated circuits of a batch of integrated circuits that comprises the integrated circuit, and (ii) the mode indicator indicates that the power gated circuit is requested to operate at the performance oriented mode.

13. A method for supplying an output supply voltage to a power gated circuit, the method comprising:
    providing to an input port of a power gating switch an input supply voltage;
    receiving, by a control circuit, a mode indicator that indicates of a desired mode of the power gated circuit;
    receiving, by the control circuit, a leakage indicator that indicates of a leakage level of the power gated circuit;
    selecting, by the control circuit, a value of a control signal based on the mode indicator and on the leakage indicator;
    supplying the control signal to a control port of the power gating switch;
    providing, from an output port of the power gating switch, the output supply voltage to the power gated circuit;
    wherein a relationship between a value of the input supply voltage and a value of the output supply voltage is responsive to the value of the control signal.

14. The method according to claim 13, comprising:
    selecting a performance value of the control signal when (i) the leakage indicator indicates that a leakage of the power gated circuit is below a low leakage threshold and (ii) the mode indicator indicates that the power gated circuit is requested to operate at a performance oriented mode;
    selecting a leakage reduction value of the control signal when (i) the leakage indicator indicates that the leakage of the power gated circuit is above the low leakage threshold and (ii) the mode indicator indicates that the power gated circuit is requested to operate at the performance oriented mode; and selecting a shut down value of the control signal when the mode indicator indicates that the power gated circuit should be shut down.

15. The method according to claim 14, comprising:

selecting the performance value of the control signal when the leakage indicator indicates that the integrated circuit is slow in comparison to most integrated circuits of a batch of integrated circuits that comprises the integrated circuit, and (ii) the mode indicator indicates that the power gated circuit is requested to operate at the performance oriented mode; and selecting the leakage reduction value of the control signal when (i) the leakage indicator indicates that the integrated circuit is fast in comparison to most integrated circuits of a batch of integrated circuits that comprises the integrated circuit, and (ii) the mode indicator indicates that the power gated circuit is requested to operate at the performance oriented mode.

16. The method according to claim 14, comprising selecting the leakage reduction value out of a group of leakage reduction values based on a temperature of the integrated circuit.

17. The method according to claim 14, comprising selecting the leakage reduction value out of a group of leakage reduction values based on a temperature of the integrated circuit and on the leakage indicator.

18. The method according to claim 14, comprising selecting a retention value of the control signal when the mode indicator indicates that the power gated circuit is requested to enter a retention mode.

19. The method according to claim 18, comprising selecting the retention value out of a group of retention values based on a temperature of the integrated circuit.

20. The method according to claim 18, wherein comprising selecting the retention value out of a group of retention values based on a temperature of the integrated circuit and on the leakage indicator.

* * * * *